United States Patent
Park

(10) Patent No.: US 6,806,150 B2
(45) Date of Patent: Oct. 19, 2004

(54) METHODS OF MANUFACTURING SEMICONDUCTOR MEMORY DEVICES WITH EPITAXIAL CONTACT NODES

(75) Inventor: Cheolsoo Park, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/746,802

(22) Filed: Dec. 26, 2003

(65) Prior Publication Data

US 2004/0142529 A1 Jul. 22, 2004

(30) Foreign Application Priority Data

Dec. 30, 2002 (KR) .............................. 10-2002-0086239

(51) Int. Cl.$^7$ ............................................ H01L 21/336
(52) U.S. Cl. ...................................... 438/300; 438/607
(58) Field of Search ................................ 438/300, 607, 438/488–489, 41, 44, 269, 357, 390, 413

(56) References Cited

U.S. PATENT DOCUMENTS

| 4,436,758 A | | 3/1984 | Thompson | 438/241 |
|---|---|---|---|---|
| 5,116,780 A | * | 5/1992 | Samata et al. | 438/492 |
| 5,753,555 A | * | 5/1998 | Hada | 438/300 |
| 5,913,135 A | * | 6/1999 | Chen | 438/489 |
| 5,946,570 A | * | 8/1999 | Kasai et al. | 438/253 |
| 6,177,320 B1 | * | 1/2001 | Cho et al. | 438/279 |
| 6,472,303 B1 | * | 10/2002 | Weon et al. | 438/597 |
| 6,521,508 B1 | * | 2/2003 | Cheong et al. | 438/416 |
| 6,562,679 B2 | | 5/2003 | Lee et al. | 438/253 |
| 2001/0040292 A1 | * | 11/2001 | Hahn et al. | 257/750 |
| 2004/0043595 A1 | * | 3/2004 | Lee et al. | 438/592 |

FOREIGN PATENT DOCUMENTS

| JP | 2001230320 A | * | 8/2001 | H01L/21/768 |
|---|---|---|---|---|
| JP | 2001244215 A | * | 9/2001 | H01L/21/285 |

\* cited by examiner

Primary Examiner—John F. Niebling
Assistant Examiner—Jennifer M. Kennedy
(74) Attorney, Agent, or Firm—Grossman & Flight, LLC

(57) ABSTRACT

According to one example method of fabricating a semiconductor memory device, an isolation layer and a capping layer are formed on a silicon substrate, sequentially. By an epitaxial silicon growth process, an epitaxial active region is formed. A gate insulation layer and a gate electrode are then formed on the epitaxial active region, sequentially. Subsequently, a bit line contact plug and a storage node contact plug are epitaxially formed on the epitaxial active region. A lower interlayer insulation layer is formed on the resultant structure and planarized. An upper interlayer insulation layer is formed on the lower interlayer insulation layer and a bit line is formed therein. An additional upper interlayer insulation layer is then formed on the entire surface of the resultant structure and a storage node electrode is formed through the additional upper and the upper interlayer insulation layer to be connected to the storage node contact.

13 Claims, 4 Drawing Sheets

METHODS OF MANUFACTURING SEMICONDUCTOR MEMORY DEVICES WITH EPITAXIAL CONTACT NODES

TECHNICAL FIELD

The present disclosure relates to semiconductors and, more particularly, to methods of manufacturing semiconductor memory devices.

BACKGROUND

In general, a memory device is an element for storing data which is retrieved from the memory device and used when necessary. The memory device mainly includes a semiconductor memory device such as a dynamic random access memory ("DRAM"), a magnetic disk, an optical disk, and the like. The semiconductor memory device is compact, highly reliable, and inexpensive and can operate at a relatively high speed; therefore, it has been widely used as a main memory in a computer and as a buried memory and a cache memory in a microprocessor.

The DRAM, a typical nonvolatile memory, includes a word line driven by a row address, a bit line driven by a column address, a cell transistor connected to the word line and the bit line, and a capacitor connected to the cell transistor, in which data is recorded.

For example, U.S. Pat. No. 6,562,679 discloses a method for forming a storage electrode of a capacitor by depositing an insulator layer on a substrate, patterning a contact hole, depositing a polysilicon into the contact hole, depositing a oxide layer, and patterning and filling a conductive material, sequentially. U.S. Pat. No. 6,436,758 discloses a method for forming a storage electrode by performing a patterning process twice times.

However, as semiconductor devices have been developed and applications thereof have been expanded, research and development for high integration of the semiconductor memory device has steadily been progressed. Further, as the semiconductor devices become scaled down due to development of a miniaturizing technique, a line width of a gate electrode of a cell transistor or a bit line and a junction depth of a source/drain are decreased, thereby causing a short channel effect that deteriorates a punch-through between the source and the drain. In addition, a contact electrode connected to such line is also getting smaller and, therefore, a size of a contact hole is getting smaller, so that a contact manufacturing process for forming the contacts or contact plugs by depositing a conductive material into the contact holes comes to have limitations when the contact holes are formed in the highly integrated semiconductor memory device.

DETAILED DESCRIPTION

Figure 1:
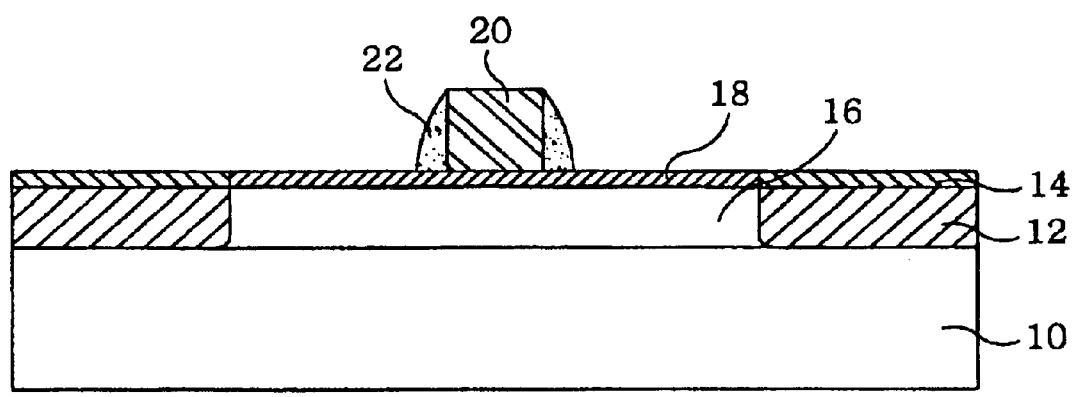
FIG. 1 illustrates a cross sectional view showing the forming of a gate electrode in a semiconductor memory device.

Referring to FIG. 1, an isolation layer 12 for isolating an active region from an inactive region is formed on a silicon substrate 10 and a silicon nitride ($Si_3N_4$) layer as a capping layer 14 is thinly formed on the isolation layer 12. According to one example, the isolation layer 12 is formed by a thermal oxidation process. An epitaxial active region 16 is formed by growing the silicon substrate 10, which is not covered with the isolation layers 12, up to a level of a top surface of the isolation layer 12 using a selective epitaxial silicon growth process. Because the capping layer 14 is formed on the isolation layer 12, only the exposed silicon substrate grows epitaxially.

Subsequently, a silicon oxide ($SiO_2$) layer as a gate insulation layer 18 is formed on the epitaxial active region 16. A doped polysilicon layer as a conductive layer is deposited on the gate insulation layer 18 and a gate electrode 20 is formed by patterning the doped polysilicon layer. A spacer insulation layer 22 is formed on sidewalls of the gate electrode 20.

Figure 2:
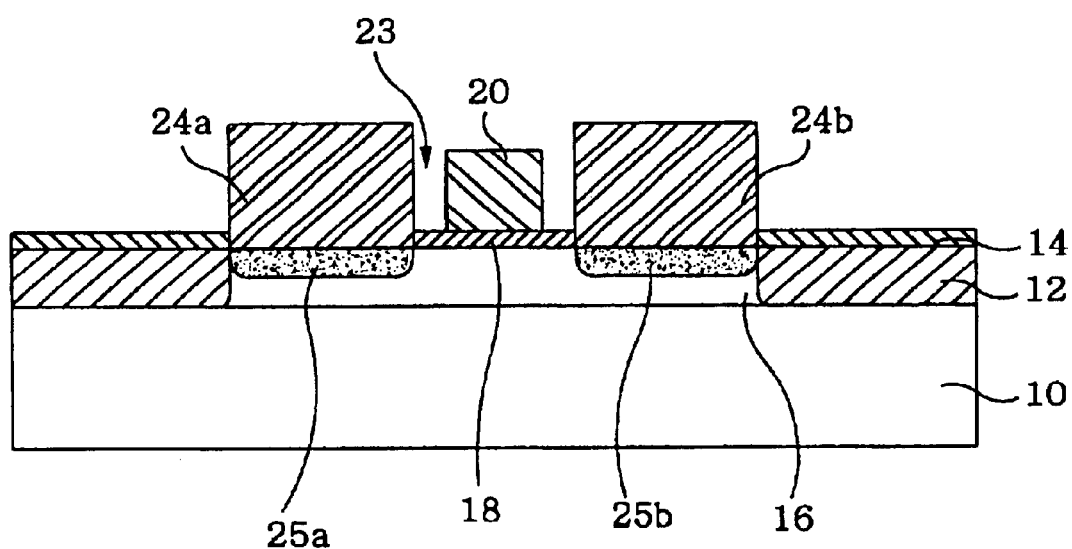
FIG. 2 depicts a cross sectional view showing the forming of a bit line contact plug and a storage node contact plug in a semiconductor memory device.

As shown in FIG. 2, the epitaxial active region 16 is exposed by etching the gate insulation layer 18 using the gate electrode 20 and the spacer insulation layer 22 as masks. Then, by growing the exposed epitaxial active region on the both sides of the gate electrode 20 using the selective epitaxial silicon growth process, a bit line contact plug 24a and a storage node contact plug 24b are formed spaced apart from both sides of the gate electrode 20, respectively.

In cases in which the bit line contact plug 24a and the storage node contact plug 24b are formed of n+/p+ doped silicon layers, respectively, a source/drain 25a, 25b is respectively formed by diffusing a n+/p+ dopant into the epitaxial active region 16 using an annealing process. Alternatively, in a case in which the bit line contact plug 24a and the storage node contact plug 24b are formed of an undoped silicon layer, the source/drain 25a, 25b are formed by diffusing the n+/p+ dopant into the epitaxial active region 16 by practicing a doped ion implantation process and an annealing process, sequentially.

Then, the spacer insulation layer 22 and the gate insulation layer 18 thereunder are removed.

As a result, the gate electrode 20 and the bit line contact plug 24a and the storage node contact plug 24b are separated by a gap 23 corresponding to the thickness of the spacer insulation layer 22, and the gap 23 will be a length of an LDD region for preventing any short channel effect, later.

Figure 3:
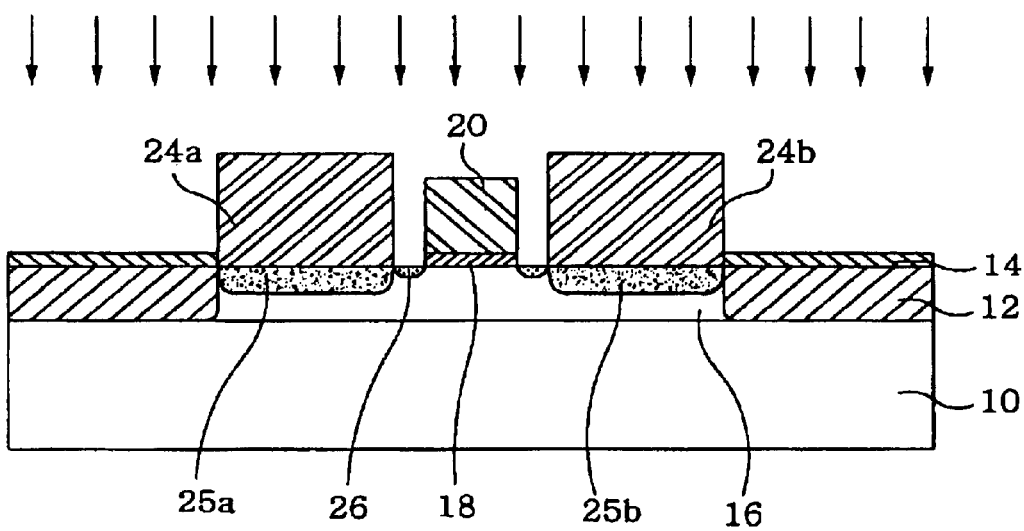
FIG. 3 describes a cross sectional view showing the forming of a lightly-doped drain (LDD) region in a semiconductor memory device.

Referring to FIG. 3, by performing an n−/p− ion implantation process, the LDD region 26 is formed into the epitaxial active region 16 between the gate electrode 20 and the bit line contact plug 24a and/or the storage node contact plug 24b. In other words, the LDD region 26 is formed in order to prevent a short channel effect.

Figure 4:
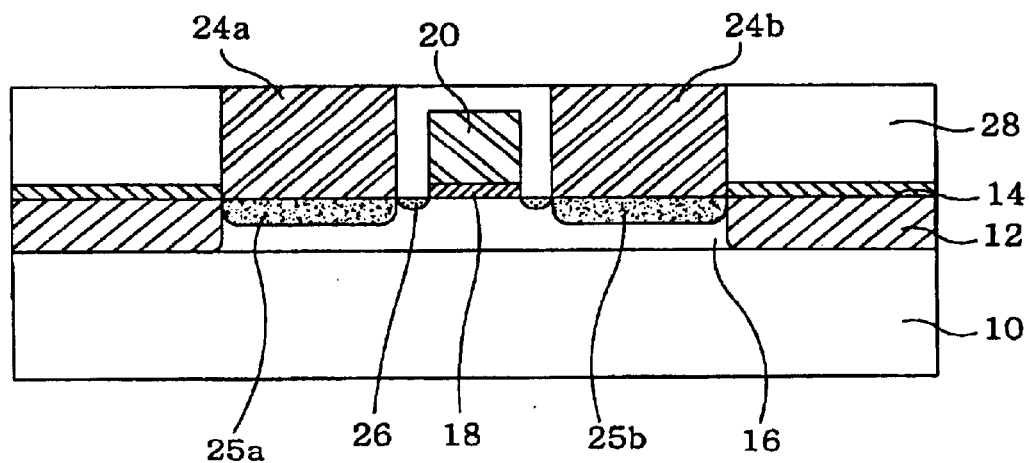
FIG. 4 offers a cross sectional view showing the forming of an interlayer insulation layer in a semiconductor memory device.

As shown in FIG. 4, a lower interlayer insulation layer 28 is formed on the entire surface of the resultant structure. The lower interlayer insulation layer 28 is planarized to expose top surfaces of the bit line contact plug 24a and the storage node contact plug 24b by a chemical mechanical polishing ("CMP") process or a whole surface etching process.

Figure 5:
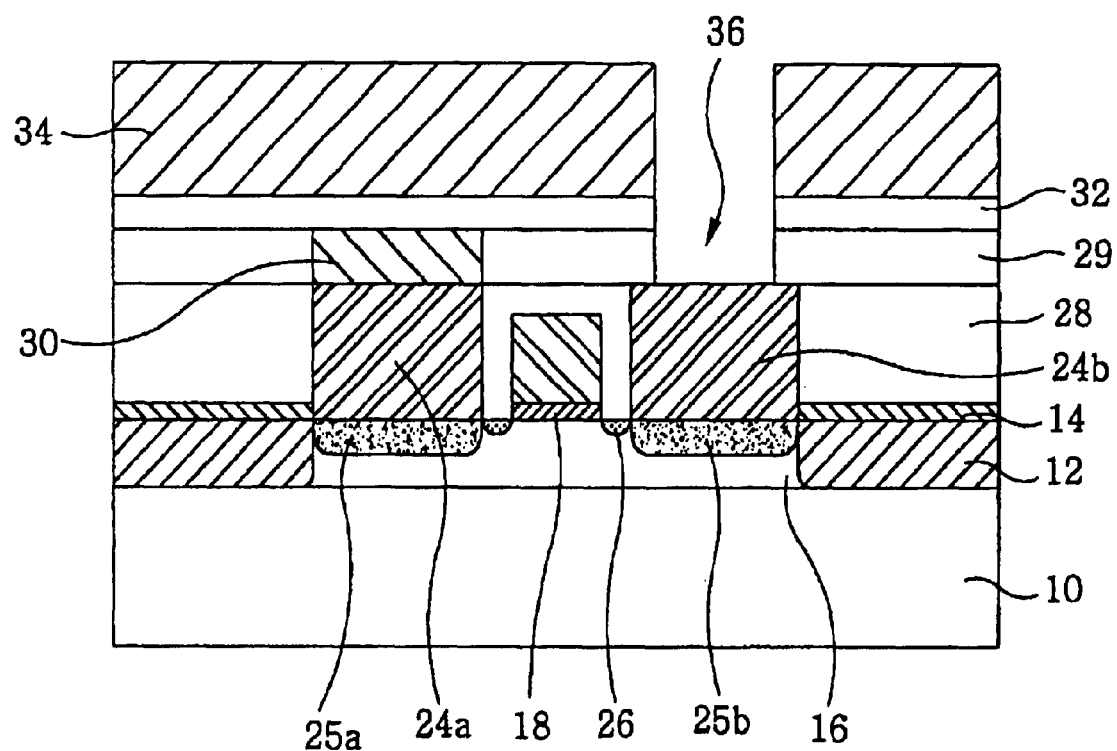
FIG. 5 shows a cross sectional view showing the forming of a storage node contact hole in a semiconductor memory device.

Referring to FIG. 5, an upper interlayer insulation layer 29 is formed on the planarized lower interlayer insulation layer 28. A bit line opening (not shown), through which the top surface of the bit line contact plug 24a is exposed, is formed by etching the upper interlayer insulation layer 29 using a damascene process. Then, tungsten as a conductive material is filled into the bit line opening of the upper interlayer insulation layer 29, thereby forming a bit line 30 connected to the bit line contact plug 24a.

Subsequently, an additional upper interlayer insulation layer 32 is formed on the entire surface of the resultant structure, and a photoresist pattern 34 is formed on the additional upper interlayer insulation layer 32 by performing a photolithography process. The additional upper interlayer insulation layer 32 and the upper interlayer insulation layer 29 are etched using the photoresist pattern 34 as a mask, simultaneously, to thereby form a contact hole 36 through which the top surface of the storage node contact plug 24b is exposed. Thereafter, the photoresist pattern 34 is removed.

Figure 6:
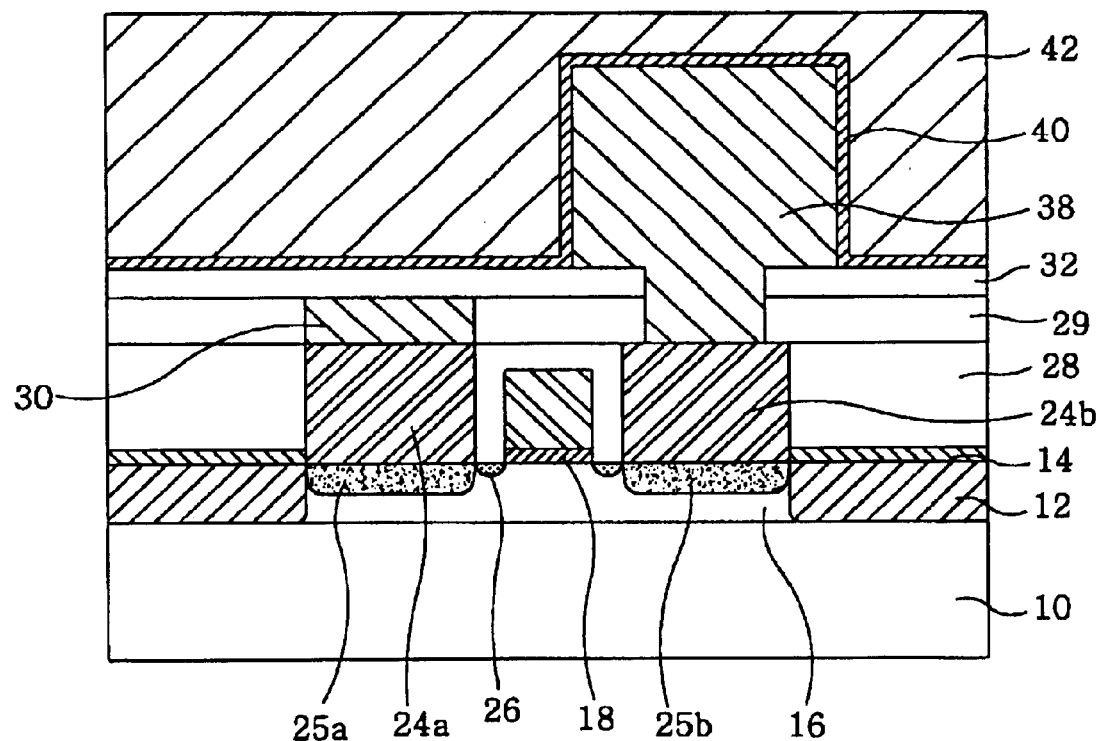
FIG. 6 illustrates a cross sectional view showing the fabricating of a capacitor in a semiconductor memory device.

Referring to FIG. 6, as a conductive layer, a doped polysilicon or a metal layer is deposited into the contact hole 36 and a storage node electrode 38, which is connected to the storage node contact plug 24b, is formed by patterning the conductive layer. The storage node electrode 38 may be formed by epitaxially growing silicon in the contact plug 24b and then patterning it, instead of using the depositing process. For example, after growing the silicon of the storage node contact plug 24b up to a desired level by an anisotropic epitaxial silicon growth process, an isotropic epitaxial silicon growth process is performed such that there occurs no short phenomenon between the storage node electrodes followed by the patterning process.

Subsequently, an oxide/nitride/oxide ("ONO") layer as a dielectric layer 40 is deposited on the surface of the storage node 38 and the additional upper interlayer insulation layer 32. After a doped polysilicon or a metal layer is deposited on the entire surface of the resultant structure, a plate node electrode 42 is formed by performing a patterning process thereon, thereby resulting in a semiconductor memory device.

Alternatively, in forming the LDD region 26, the LDD region 26 may be formed using the lower interlayer insulation layer 28 made of a borosilicate glass ("BSG") or a phosphosilicate glass ("PSG") instead of the ion implantation process described above. Specifically, after the spacer insulation layer 22 and the gate insulation layer thereunder is removed, the lower interlayer insulation layer 28 made of the BSG or the PSG is formed on the entire surface of the resultant structure. The LDD region 26 is then formed by diffusing B (p dopant) or P (n dopant) of the lower interlayer insulation layer 28 into the epitaxial active region 16 between the gate electrode 20 and the bit line contact plug 24a and/or the storage node contact plug 24b using the annealing process.

As disclosed herein, the active region of the silicon substrate, the bit line contact plug, the storage node contact plug and the storage node electrode are formed by performing a selective epitaxial silicon growth process. As a result, a short channel effect in the highly integrated semiconductor devices can be prevented and a contact hole manufacturing process required to form the bit line contact plug and the storage node contact plug can be eliminated.

Although certain example methods are disclosed herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of fabricating a semiconductor memory device, the method comprising:

forming an isolation layer on a semiconductor substrate and forming a capping layer on the isolation layer;

forming an epitaxial active region, which is not covered with the isolation layer, on said semiconductor substrate by selective epitaxial growth;

forming a gate insulation layer and a gate electrode on said epitaxial active region, sequentially;

forming a bit line contact plug and a storage node contact plug spaced apart from the both sides of said gate electrode on said semiconductor substrate by epitaxially growing, respectively;

forming a source/drain into said epitaxial active region on which said bit line contact plug and said storage node contact plug are formed;

forming a lower interlayer insulation layer on the entire surface of the resultant structure and planarizing the lower interlayer insulation layer to expose a top surface of said bit line contact plug and said storage node contact plug;

forming an upper interlayer insulation layer on the entire surface of the resultant structure after said lower interlayer insulation layer is planarized and forming a bit line in the upper interlayer insulation layer, wherein the bit line is connected to the bit line contact plug;

forming an additional upper interlayer insulation layer on the resultant structure;

forming a storage node electrode connected to said storage node contact plug through said additional upper interlayer insulation layer and said upper interlayer insulation layer; and forming a dielectric layer and a plate node electrode on the entire surface of the resultant structure, sequentially.

2. A method as defined by claim 1, further comprising:

forming a spacer insulation layer on sidewalls of said gate electrode and patterning said gate insulation layer using said gate electrode and said spacer insulation layer as a mask, after said gate electrode is formed; and removing said spacer insulation layer, after said bit line contact plug and said storage node contact plug are formed.

3. A method as defined by claim 1, wherein said bit line contact plug and said storage node contact plug comprise a doped silicon layer.

4. A method as defined by claim 3, wherein said source/drain is formed by performing an annealing process.

5. A method as defined by claim 1, wherein said bit line contact plug and said storage node contact plug comprise an undoped silicon layer.

6. A method as defined by claim 5, said source/drain is formed by performing an ion implantation process and an annealing process, sequentially.

7. A method as defined by claim 1, further comprising:

forming a lightly doped drain ("LDD") region into said epitaxial active region between said gate electrode and said bit line contact plug and/or said storage node contact plug, before said lower interlayer insulation layer is formed.

8. A method as defined by claim 7, wherein said lightly doped drain ("LDD") region is formed by performing an ion implantation process.

9. A method as defined by claim 1, wherein said lower interlayer insulation layer is made of a borosilicate glass ("BSG") or a phosphosilicate glass ("PSG").

10. A method as defined by claim 9, further comprising:

forming a lightly doped drain ("LDD") region into said epitaxial active region between said gate electrode and said bit line contact plug or said storage node contact plug by performing an annealing process, after the formation of said lower interlayer insulation layer made of the borosilicate glass ("BSG") or the phosphosilicate glass ("PSG").

11. A method as defined by claim 1, wherein said storage node electrode is formed by depositing a doped polysilicon or a metal layer and patterning it.

12. A method as defined by claim 1, wherein said storage node electrode is formed by performing an epitaxial growth process and a patterning process on the silicon of said storage node contact plug, sequentially.

13. A method as defined by claim 12, wherein said epitaxial growth process includes an anistropic epitaxial silicon growth process for growing the silicon in said storage node contact plug up to a desired level and an isotropic epitaxial silicon growth process.

* * * * *